United States Patent
Tanzawa

(10) Patent No.: US 8,861,274 B2
(45) Date of Patent: Oct. 14, 2014

(54) COMPENSATING FOR OFF-CURRENT IN A MEMORY

(75) Inventor: Toru Tanzawa, Tokyo (JP)

(73) Assignee: Intel Corporation, Santa Clara, CA (US)

( * ) Notice: Subject to any disclaimer, the term of this patent is extended or adjusted under 35 U.S.C. 154(b) by 78 days.

(21) Appl. No.: 13/592,454

(22) Filed: Aug. 23, 2012

(65) Prior Publication Data

US 2014/0056077 A1    Feb. 27, 2014

(51) Int. Cl.
*G11C 16/04*    (2006.01)

(52) U.S. Cl.
USPC ................................ 365/185.17; 365/185.2

(58) Field of Classification Search
USPC .......................... 365/185.17, 185.2
See application file for complete search history.

(56) References Cited

U.S. PATENT DOCUMENTS

2013/0070528 A1*    3/2013    Maeda .................... 365/185.11
2013/0194855 A1*    8/2013    Franca-Neto .................. 365/72

OTHER PUBLICATIONS

Katsumata, R. et al. Pipe-shaped BiCS Flash Memory with 16 Stacked Layers and Multi-Level-Cell Operation for Ultra High Density Storage Devices, 2009 Symposium on VLSI Technology Digest of Technical Papers, 2009, pp. 136-137.
Jang, J. et al., Vertical Cell Array using TCAT (Terabit Cell Array Transistor) Technology for Ultra High Density NAND Flash Memory, 2009 Symposium on VLSI Technology Digest of Technical Papers, 2009, pp. 192-193.
Kim, J. et al., Novel Vertical-Stacked-Array-Transistor (VSAT) for ultra-high-density and cost-effective NAND Flash memory devices and SSD (Solid State Drive), 2009 Symposium on VLSI Technology Digest of Technical Papers, 2009, pp. 186-187.
Kim, W. et al., Multi-Layered Vertical Gate NAND Flash Overcoming Stacking Limit for Terabit Density Storage, 2009 Symposium on VLSI Technology Digest of Technical Papers, 2009, pp. 188-189.
Chiang, M., Novel High-Density Low-Power Logic Circuit Techniques Using DG Devices, IEEE Transactions on Electron Devices, Oct. 2005, pp. 2339-2342, vol. 52, No. 10.
Tanaka, H. et al., Bit Cost Scalable Technology with Punch and Plug Process for Ultra High Density Flash Memory, 2007 Symposium on VLSI Technology Digest of Technical Papers, 2007, pp. 14-15.

\* cited by examiner

*Primary Examiner* — Huan Hoang
(74) *Attorney, Agent, or Firm* — Cool Patent, P.C.

(57) ABSTRACT

A memory cell is accessed by determining an off-current of a set of memory cells, accessing a memory cell of the set of memory cells during an access period, and compensating for the off-current of the set of memory cells.

29 Claims, 5 Drawing Sheets

COMPENSATING FOR OFF-CURRENT IN A MEMORY

BACKGROUND

1. Technical Field

The present subject matter relates to semiconductor memory, and more particularly, to compensating for an off-current of the memory.

2. Background Art

Many types of semiconductor memory are known in the art. One type of memory is flash memory which stores charge in a charge storage region of a memory cell. The voltage threshold of the metal-oxide-semiconductor field-effect transistor (MOSFET) based flash cell can be changed by changing the amount of charge stored in the charge storage region of the cell, and the voltage threshold can be used to indicate a value that is stored in the flash cell. By providing a voltage across the flash cell that is between the voltage thresholds of the two different states of the flash cell, the state of the flash cell can be determined by measuring current flowing through the flash cell. A flash cell has a much higher on-current than off-current.

Another type of memory is phase change memory (PCM). PCMs utilize a phase change material having a non-conductive amorphous state and a conductive crystalline state. A PCM cell may be put into one state or the other to indicate a stored value. By providing a potential across the PCM cell, the state of the PCM cell can be determined by measuring current flowing through the PCM cell. A PCM cell has a much higher on-current than off-current.

One architecture in common use for memories is a NAND architecture. In a NAND architecture, two or more memory cells are coupled together into a string, with the individual cell control lines coupled to word lines. A NAND string may be coupled to a bit line at one end of the NAND string. A bit of a NAND string may be read by addressing one cell of the string and turning on all the other cells in the string. If the addressed memory cell is on, the on-current will flow through the string, but if the addressed memory cell is off, only an off-current, which is much lower than the on-current will flow.

Some memory devices may create stacks of memory cells in a three-dimensional array. A stack of memory cells may include any number of memory cells. In some cases, the cells of a stack may be coupled into a NAND string but in other cases, multiple layers of control lines may be used to address cells of layer individually.

BRIEF DESCRIPTION OF THE DRAWINGS

The accompanying drawings, which are incorporated in and constitute part of the specification, illustrate various embodiments. Together with the general description, the drawings serve to explain various principles. In the drawings.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Reference now is made in detail to the examples illustrated in the accompanying drawings and discussed below.

Figure 1A:
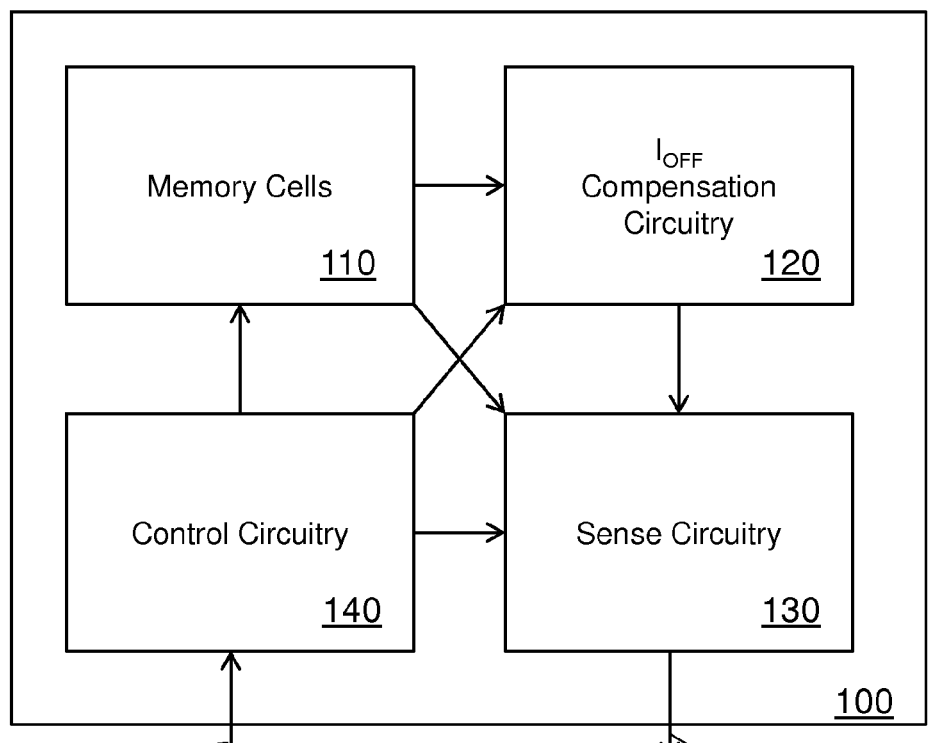
FIG. 1A is a block diagram of an embodiment of a memory that compensates for off-current.

FIG. 1A is a block diagram of an embodiment of a memory 100 that compensates for off-current. The memory 100 may include two or more memory cells 110, which may be a large number of memory cells, such as millions or even billions of memory cells or more, depending on the embodiment. The memory cells 110 may include any type of memory technology that has different current flow through a memory cell depending on the state of the memory cell, such as, but not limited to floating gate flash, charge trap flash (CTF), nanowire based memory, ferro-electric transistor random access memory (FeTRAM), resistive random access memory (RRAM), phase-change memory (PCM), and PCM with switch (PCMS). The memory cells 110 may use any logical architecture, including NAND, NOR, or other logical architecture, and may use any physical embodiment, such as a traditional two dimensional memory array, multiple layers of two-dimensional arrays built on top of each other, vertical stacks of memory cells organized as a three dimensional array, or other physical embodiments. The memory cells 110 may be organized to couple sets of memory cells to sense nodes, and in many embodiments, an individual memory cell may be coupled to a single sense node, although other embodiments may allow for an individual memory cell to be selectively coupled to more than one sense node.

The memory cells 110 may be coupled to $I_{OFF}$ compensation circuitry 120 which may be capable of determining an off-current ($I_{OFF}$) of the memory cells 110. The $I_{OFF}$ compensation circuitry 120 may be coupled to the sense nodes and, in embodiments, may be capable to determine a combined $I_{OFF}$ of the set of memory cells coupled to an individual sense node and/or compensate for the combined $I_{OFF}$ of the set of memory cells coupled to an individual sense node. In some embodiments $I_{OFF}$ may said to be determined by setting a maximum level of current in the $I_{OFF}$ compensation circuitry 120 based on $I_{OFF}$.

Sense circuitry 130 may be coupled to sense nodes of the memory cells 110. The sense circuitry 130 may determine a state of an accessed memory cell in the memory cells 110 during an access period. In some embodiments, the sense circuitry 130 may provide a load current to a sense node during the access period and detect a voltage level on the sense node to determine the state of the accessed memory cell. In other embodiments, the sense circuitry 130 may not include a current source, and may simply measure, or detect, an electrical parameter such as voltage, of the sense node to determine the state of the memory cell. The sense circuitry 130 may provide an output 104 that indicates the detected state of the accessed memory cell.

The memory 100 may include control circuitry 140 to receive an access of the memory cells 110 through an interface 102. In some embodiments, the interface 102 and the output 104 may utilize at least some of the same physical conductors. The control circuitry 140 may include a finite state machine, a micro-sequencer with microcode to execute on the micro-sequencer, a processor with instructions to execute on the processor, or any combination of such mechanisms or other mechanisms for controlling various lines in electronic circuitry. The control circuitry 140 may decode the access and determine which memory cell of the memory cells 110 is to be accessed. The control circuitry 140 may initiate an access period in response to the access and may communicate with the memory cells 110, $I_{OFF}$ compensation circuitry 120, and the sense circuitry 130 to determine the state of the accessed memory cell with compensation for the combined $I_{OFF}$ of the memory cells coupled to the same sense node as the accessed memory cell. The control circuitry 140 may also initiate a sample period to determine $I_{OFF}$. The sample period may occur in response to an access, a period of time since the last sample period, a change of temperature of the memory 100, or any other stimulus, depending on the embodiment.

In some embodiments, the set of memory cells coupled to an individual sense node may include a large number of memory cells, such as millions of memory cells or more. While the off-current of a single memory cell may be negligible compared to the current that is able to flow through the single memory cell in the on state, $I_{ON}$, the combined $I_{OFF}$ for the set of memory cells coupled to a single sense node may be large enough to make it difficult to reliably detect the difference between the combined $I_{OFF}$ of the set of memory cells coupled to a single sense node and $I_{ON}$. The $I_{OFF}$ compensation circuitry 120 may compensate for the combined $I_{OFF}$ of the set of memory cells to make determining the state of the accessed memory cell more reliable. By compensating for the combined $I_{OFF}$ of the memory cells coupled to a sense node, it may be possible reliably detect the state of a single memory cell with many more memory cells coupled to a single sense node than would be possible without $I_{OFF}$ compensation.

Figure 1B:
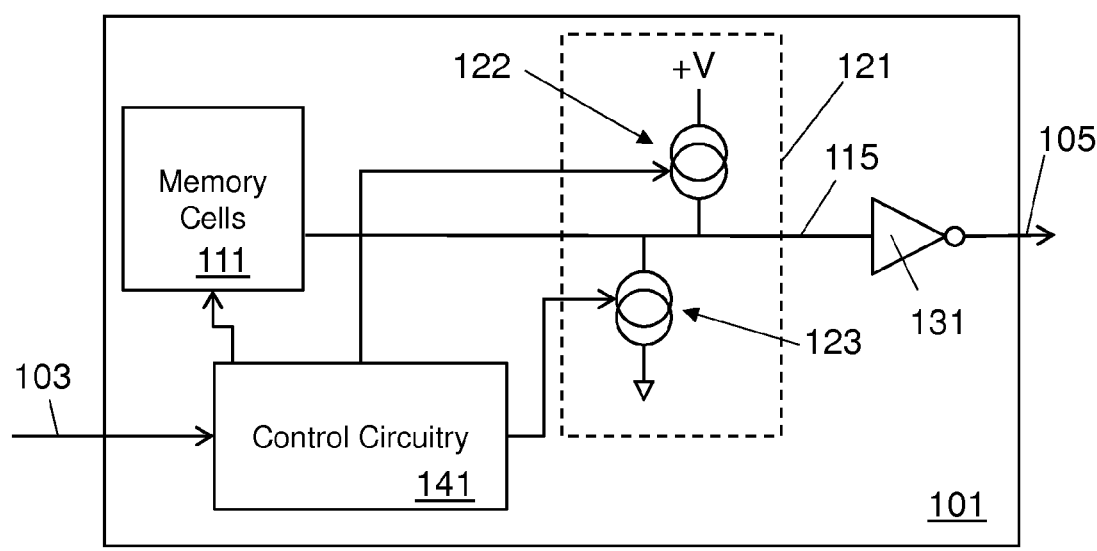
FIG. 1B is a more detailed block diagram of an embodiment of a memory that compensates for off-current.

FIG. 1B is a more detailed block diagram of an embodiment of a memory 101 that compensates for off-current ($I_{OFF}$). The memory 101 may include memory cells 111 that are coupled to a sense node 115. Sense circuitry such as a sense amplifier 131 may be coupled to the sense node 115 and be able to sense a voltage level of the sense node 115 so that the sense amplifier 131 may communicate the state of an accessed memory cell to an external or internal output 105. Compensation circuitry 121 may include reference current circuitry 123 and compensation current circuitry 122 coupled to the sense node 115.

The control circuitry 141 may initiate a sample period to determine a combined $I_{OFF}$ current of the memory cells 111 that are coupled to the sense node 115. During the sample period, the control circuitry 141 may deselect the memory cells 111 and may enable the reference current circuitry 123 to provide a reference current at the sense node 115. The reference current may be less than an on-current ($I_{ON}$) of a single memory cell of the memory cells 111. The value of the reference current may be determined at design time, or may be based on measurements taken of $I_{ON}$ during operation of the memory 101. The control circuitry 141 may also set the compensation current circuitry 122 to provide up to a maximum value of compensation current during the sample period. The compensation current circuitry 122 may continue to provide up to the set maximum value of compensation current at the sense node 115 after the sample period is ended, such as during the access period. The maximum value of the compensation current may be based on the combined $I_{OFF}$ of the memory cells 111 and the reference current. To satisfy Kirchoff's current law, the sum of the currents flowing into the sense node is equal to zero. So if the memory cells 111 are deselected so that $I_{OFF}$ current is flowing through the memory cells 111, and if the current flowing into the sense amplifier 131 is negligible, the maximum value of the compensation current, plus a value of the reference current, plus a value of $I_{OFF}$, is about equal to zero, with the currents being defined as positive flowing into the sense node 115.

The control circuitry 141 may initiate the access period in response to the access of the memory received through the control input 103. The control circuitry 141 may select a memory cell of the memory cells 111 and disable the reference current circuitry 123 during the access period. The control lines used by the control circuitry 141 may vary according to the embodiment, but may include bit lines and word lines to the memory cells 111. The control circuitry 141 may enable the compensation current circuitry 122 to provide a compensation current at the sense node 115 during the access period. The maximum value of the compensation current may have been previously set during a sample period. The control circuitry 141 may also enable the sense amplifier 131 to determine a state of the accessed memory cell by sensing a voltage level of the sense node 115. Because the value of the reference current provided by the reference current circuitry 123 during the sample period was less than $I_{ON}$ of an accessed memory cell, if the accessed memory cell is 'OFF,' the maximum current provided by the compensation current circuitry 122 is more than $I_{OFF}$, causing the voltage of the sense node 115 to rise and the output 105 to be a '0'. If the accessed memory cell is 'ON,' $I_{ON}$, which is greater than the reference current, is greater than the maximum compensation current provided by the compensation current circuitry 122, allowing the maximum compensation current to flow through the accessed memory cell, so the sense node 115 is at a low voltage level and the output 105 is a '1'.

In the memory 101, the following equations describe the setting a maximum value ($I_{MAXCOMP}$) of the compensation current ($I_{COMP}$) from the compensation current circuitry 122 during a sample period based on the reference current ($I_{REF}$) and the off-current ($I_{OFF}$) with $I_{COMP}$ defined as a positive value for current flowing into the sense node 115, and $I_{REF}$, $I_{ON}$ and $I_{OFF}$ defined as positive values for current flowing out of the sense node 115.

$$I_{MAXCOMP} - I_{REF} - I_{OFF} = 0 \text{ so } I_{MAXCOMP} = I_{REF} + I_{OFF}$$

Where: $I_{COMP} \leq I_{MAXCOMP}$ and $I_{REF} < I_{ON}$

If a relatively large number of memory cells are coupled to the sense node, having one memory cell 'ON' may not have a significant effect on the value of the current flowing through the remaining memory cells that are 'OFF', so the amount of current flowing through the remaining memory cells remains essentially $I_{OFF}$. The current through the accessed memory cell in an 'ON' state is $I_{MEM}$ which is defined as a positive value out of the sense node 115. So the following equations represent the current during the access period if the accessed memory cell is in the 'ON' state:

$$I_{COMP} - I_{MEM} - I_{OFF} = 0 \text{ so } I_{COMP} = I_{MEM} + I_{OFF} \text{ and}$$

$$I_{COMP} \leq I_{MAXCOMP} = I_{REF} + I_{OFF} < I_{ON} + I_{OFF} \text{ so:}$$

$$I_{MEM}+I_{OFF}<I_{ON}+I_{OFF} \text{ and}$$

$$I_{MEM}<I_{ON}$$

The equations above show that the current flowing through the accessed memory cell is less than the current that could flow through the memory cell in the 'ON' state, so the voltage at the sense node 115 is about equal to the voltage across the 'ON' memory cell, which is a relatively low voltage.

If the accessed memory cell is in the 'OFF' state, the following equations apply during the access period:

$$I_{COMP}-I_{OFF}=0 \text{ so } I_{COMP}=I_{OFF} \text{ and } I_{MAXCOMP}=I_{REF}+I_{OFF} \text{ so:}$$

$$I_{COMP}<I_{MAXCOMP}$$

The equations above show that the actual compensation current, if the accessed memory cell is 'OFF,' is less than the maximum compensation current set during the sample period. This allows the compensation current to charge the capacitance of the sense node 115 and causes the voltage at the sense node 115 to rise to something close to the supply voltage of the compensation current source 122.

In some embodiments, the control circuitry 141 may receive a second memory access and initiate a second access period without initiating another sample period to re-set the maximum compensation current based on $I_{OFF}$. $I_{OFF}$ may not change much in the time between memory accesses so the maximum compensation current may not be changed for every access. So the control circuitry 141 may initiate a second access period, disable the reference current circuitry 123, and enable the compensation current circuitry 122 to provide up to the maximum value of compensation current at the sense node 115 during the second access period. The control circuitry 141 may also enable the sense circuitry 131 to determine a state of another memory cell in the memory cells 111 by sensing a voltage level of the sense node 115.

A second sample period may be initiated by the control circuitry 141 for various reasons in embodiments. In at least one embodiment, a temperature of the memory cells 111 may be monitored and a sample period initiated in response to a change in the temperature of the memory cells 111 because $I_{OFF}$ may be dependent on temperature for some memory technologies. In some embodiments, a sample period may be initiated in response to a memory access, before the access period is initiated. In some embodiments, a sample period may be initiated after a predetermined period of time has elapsed since the previous sample period or in response to a memory access if the predetermined period of time has elapsed since the last sample period. In some embodiments, the predetermined period of time is greater than about 1 microsecond (µs), although other embodiments may use shorter or longer predetermined periods. Other embodiments may initiate a sample period based on other events.

During a sample period, the control circuitry 141 may deselect the memory cells 111, enable the reference current circuitry 123 to provide the reference current at the sense node 115, and re-set the compensation current circuitry 122 to provide up to a new maximum value of compensation current at the sense node 115 during an access period. The new maximum value of the compensation current is based on a combined off-current of the memory cells 111 during the sample period, and the reference current.

Figures 2A, 2B:
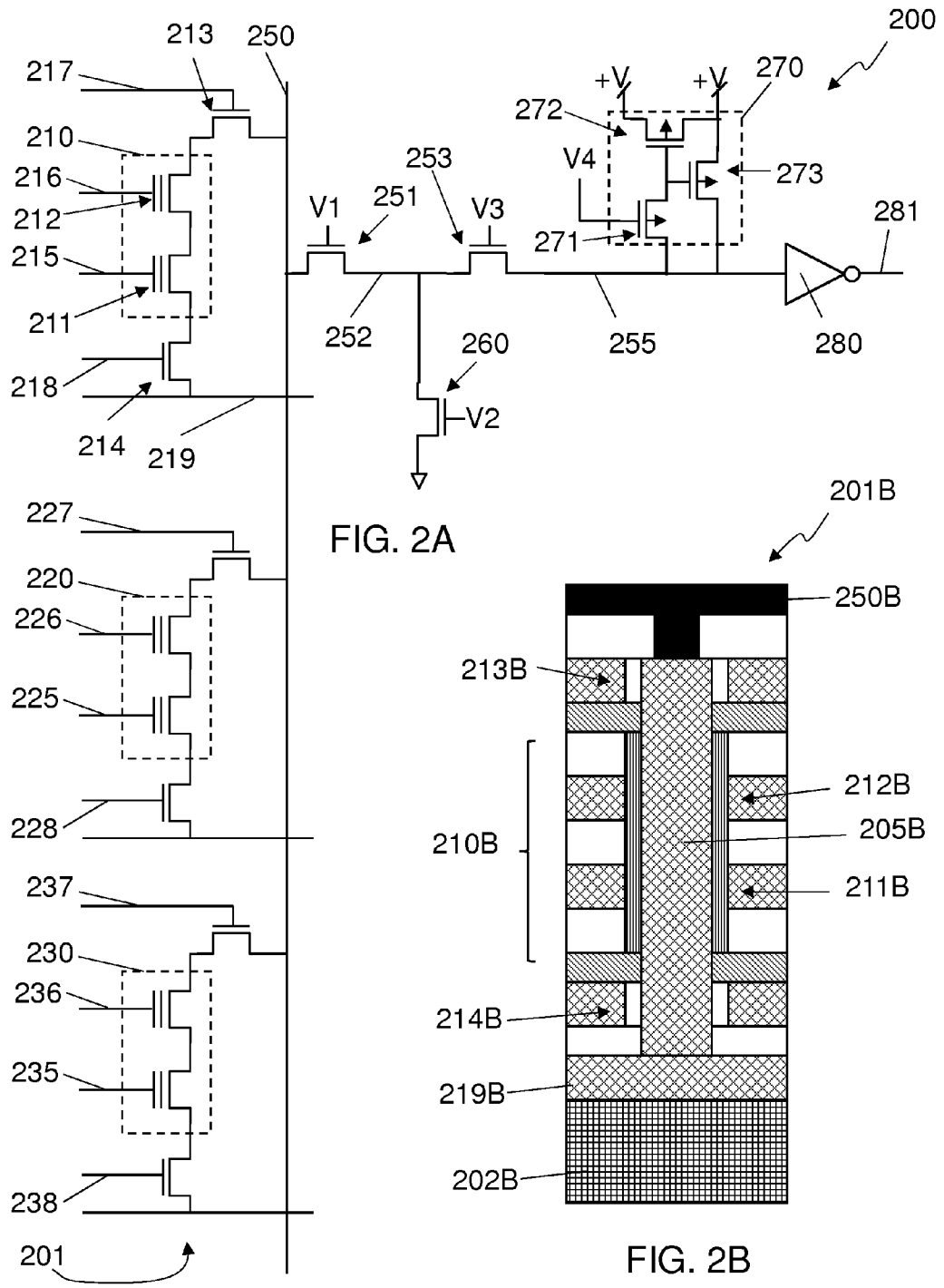
FIG. 2A is a schematic of an embodiment of a memory that compensates for off-current.
FIG. 2B is a cross-sectional view of stacked NAND memory cells.

FIG. 2A is a schematic of an embodiment of a memory 200 that compensates for off-current. In some embodiments the memory 200 may include two or more memory cells 201 that are organized into two or more NAND strings of memory cells. The memory 200 shown includes a set of memory cells 201 coupled to a sense node 255. In the embodiment shown, the memory cells 201 are organized in a NAND architecture. A first NAND string 210 is coupled to a bit line 250 by source select gate 213 and to a drain line 219 by drain select gate 214. A source select line 217 may control the source select gate 213 and a drain select line 218 may control the drain select gate 214. The first NAND string 210 includes a first flash cell 211 and a second flash cell 212. A first word line 215 is coupled to the control gate of the first flash cell 211 and a second word line 216 is coupled to the control gate of the second flash cells 212. A second NAND string 220, which also includes two flash cells, is coupled to the bit line 250 and is controlled by a variety of control lines 225-228. A third NAND string 230, which also includes two flash cells, is coupled to the bit line 250 and is controlled by a variety of control lines 235-238. Control lines 215-218, 225-228, 235-238 may be driven from control circuitry (not shown in FIG. 2A). Other embodiments may include NAND strings with any number of memory cells. Some embodiments may have NAND strings with a number of memory cells that is a power of 2 such as 8, 16, 32, 64, or larger powers of 2. Embodiments may have any number of NAND strings coupled to the bit line 250.

In at least one embodiment, the memory cells 201 may be organized as a three-dimensional array of NAND flash with individual word lines coupled to rows of individual cells on a single layer, and bit lines coupled to columns of NAND strings at the ends of the NAND strings. FIG. 2B is a cross-sectional view of stacked NAND memory cells 201B. A substrate 202B may be a silicon wafer or other suitable base for constructing the vertical NAND stack. A drain line 219A may be coupled to a semiconductor pillar 205B. The semiconductor pillar 205B may be any suitable semiconductor, but may be made of polysilicon in some embodiments. A drain select gate 214B, using a portion of the pillar 205B as the channel, may be formed to allow the drain line 219A to be isolated from, or coupled to, the rest of the pillar 205B. A NAND string 210B may be formed on top of the drain select gate 214B that includes a first flash cell 211B and a second flash cell 212B that utilize the semiconductor pillar 205B as their channels as well as to couple the two flash cells 211B, 212B into a NAND string. A source select gate 213B may be formed on top of the NAND string 210B to couple the NAND string 210B to the bit line 250B. Various other three-dimensional structures may be used in other embodiments. So the two or more memory cells 201 may include one or more stacks of memory cells.

An isolation transistor 251 may couple the bit line 250 to an intermediate node 252 in some embodiments. In some embodiments, additional isolation transistors may couple additional bit lines to the intermediate node 252 which may couple additional memory cells to the intermediate node. A control voltage V1 may be driven from the control circuitry. Reference current circuitry 260, which may be a single transistor in some embodiments although other embodiments may utilize different circuitry, may be coupled between the intermediate node 252 and ground. The current level of the reference current circuitry 260 may be determined by the voltage level V2 which may be driven by the control circuitry. A clamping transistor 253, driven by voltage V3 from the control circuitry, may be used in some embodiments to couple the intermediate node 252, and therefore the memory cells 201, to the sense node 255, and to limit a voltage level driven from the sense node 255 to the intermediate node 252 and then on to the memory cells 201. A sense amplifier 280 may also be coupled to the sense node 255 to determine a voltage level of the sense node 255. The output 281 of the sense amplifier 280 may be used to indicate a state of a selected memory cell.

Compensation current circuitry 270 may be coupled to the sense node 255. Various embodiments may utilize different circuits for the compensation current circuitry 270, but in the embodiment shown, a p-channel field effect transistor (pFET) 273 may be used to control a current flowing from a positive supply voltage to the sense node 255. Another pFET 272 may be used as a capacitor, with both source and drain coupled to the positive supply voltage and the control gate of the pFET 272 coupled to the control gate of the pFET 273. Another pFET 271 may be used to set the voltage level at the control gate of the pFET 273. Control circuitry may drive the voltage level V4 to the control gate of the pFET 271. If V4 is grounded, pFET 271 is turned on and the voltage level of the control gate of pFET 273 may vary. If V4 is at a voltage level of the positive supply voltage or higher, pFET 271 is turned off and the pFET 272, acting as a capacitor, may maintain the voltage level at the control gate of the pFET 273, thereby limiting the current of the compensation current circuitry 270.

During a sample period, the control circuitry may drive the control lines 215-218, 225-228, 235-238 of the memory cells 201 to deselect the memory cells 201. The voltage levels of the control lines 215-218, 225-228, 235-238 to deselect the memory cells 201 may vary according to the embodiment. With the memory cells 201 deselected, only an $I_{OFF}$ current may be flowing through the memory cells 201. The control circuitry may also drive V1 to turn on the isolation transistor 251 and V3 to turn on the clamping transistor 253 to allow $I_{OFF}$ to be applied at the sense node 255. The voltage level V2 from the control circuitry may set an amount of reference current flowing from the sense node 255. The voltage level V2 may be chosen at design time to set the reference current level to be less than an expected on-current from a selected memory cell for the set of memory cells 201. In one embodiment utilizing NAND flash cells, an expected on-current might be a minimum of 100 nanoamperes (nA), so the reference current might be set to about 50 nA. Other embodiments may have different expected on-current and associated reference current levels, such as a memory with a minimum expected on-current of 1 milliamp (mA) and a reference current of about 500 micro-amperes (µA), or a memory with a minimum expected on-current of 10 nA and a reference current of about 5 nA, although other embodiments that are any value of current and may be higher or lower than the examples discussed. The control circuitry may then drive V4 to ground to turn on pFET 271 and set the compensation current circuitry 270 to have a maximum current level of about 500 µA+$I_{OFF}$. At the end of the sample period, V4 may be driven back to a high level to turn off pFET 271 so that the maximum current of the compensation current circuitry 270 remains set to about 500 µA+$I_{OFF}$, and then drive V2 to ground to turn off the reference current circuitry 260.

During an access period, the control circuitry may drive the control lines 215-218, 225-228, 235-238 of the memory cells 201 to select a memory cell of the memory cells 201. As an example, to select the first memory cell 211 of the NAND string 210, the control lines 225-228 of the second NAND string 220 and the control lines 235-238 of the third NAND string 230 may be driven so that the second NAND string 220 and the third NAND string 230 are deselected such as driving the control lines 225-228, 235-238 to ground. The control circuitry may drive the drain line 219 to a low level and turn on the drain select gate 214 using drain select line 218 and the source select gate 213 using the source select line 217 while providing a voltage on the second word line 216 that is high enough to turn on the second memory cell 212 regardless of its state. The first word line 215 may then be driven to a voltage level that is between the voltage threshold to turn on the first memory cell 211 if the first memory cell 211 is 'ON,' and the voltage threshold to turn on the first memory cell 211 if the first memory cell 211 is 'OFF'. The control circuitry may also drive V1 to turn on the isolation transistor 251 and V3 to turn on the clamping transistor 253. With V2 driven to ground to keep the reference current circuitry 260 off, and V4 driven to ground to keep the maximum current of the compensations current circuitry 270 unchanged, the compensation current may flow from the compensation current circuitry 270 through the clamping transistor 253 and the isolation transistor 251 into the memory cells 201. Compensation current approximately equal to $I_{OFF}$ may flow through the deselected memory cells, with the remainder available to flow through the first NAND string 210 that contains the selected memory cell 211.

Consistent with the example above, say that the on-current flowing through the NAND string 210 can be at least 100 nA if the first memory cell 211 is 'ON,' which is greater than the value of the reference current during the sample phase of about 50 nA. So if the state of the first memory cell 211 is 'ON,' the maximum value of the compensation current flows from the compensation current circuitry 270 with compensation current approximately equal to $I_{OFF}$ flowing through the deselected memory cells, and about 50 nA flowing through the first NAND string 210. Because the current flowing through the selected memory cell 211 is less than a maximum on-current of the memory cell 211, the sense node 255 is at a low voltage level which may be detected by the sense amplifier 280.

If the state of the first memory cell 211 is 'OFF,' the compensation current flowing from the compensation current circuitry 270 during the access period is only about $I_{OFF}$, which is less than the maximum compensation current set during the sample period. Because of this, the compensation current circuitry 270 may bring the voltage level of the sense node 255 high, which may be detected by the sense amplifier 280.

Figure 3:
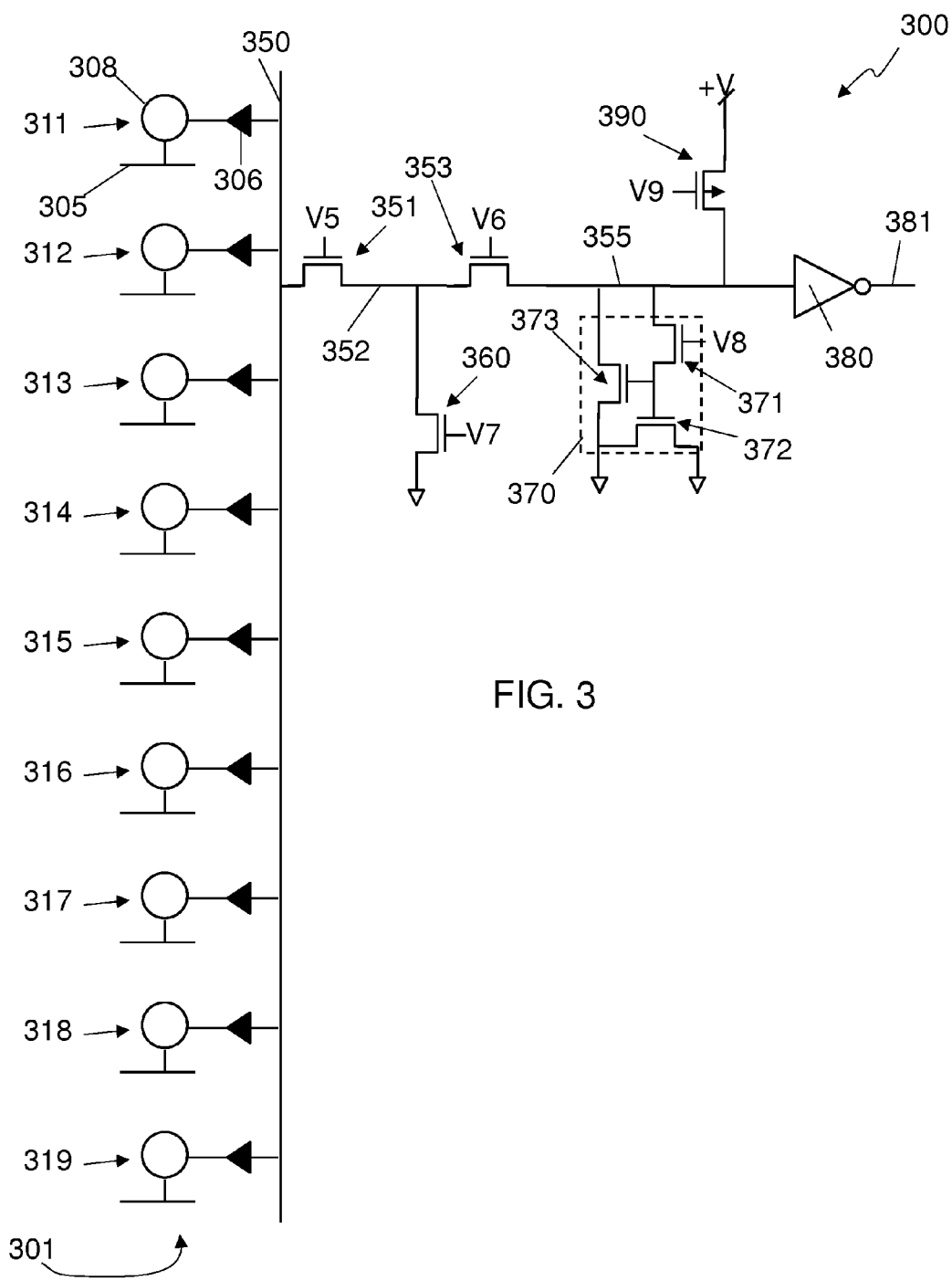
FIG. 3 is a schematic of an alternative embodiment of a memory that compensates for off-current.

FIG. 3 is a schematic of an alternative embodiment of a memory 300 that compensates for off-current. The memory 300 uses phase change memory with switch (PCMS) cells 301 in a NOR architecture. An exemplary PCMS cell 311 includes phase change material 308 and a switch 306 coupled between a word line 305 and a bit line 350. Additional PCMS cells 312-319 may be coupled to the bit line 350. Any number of PCMS cells may be coupled to the bit line 350 in various embodiments. Some embodiments may include an isolation transistor 351, controlled by a voltage level V5, to couple the bit line 350 to an intermediate node 352. Some embodiments may have additional isolation transistors that may couple additional bit lines and their associated memory cells to the intermediate node 352. Reference current circuitry 360 may be coupled to the intermediate node 352. Some embodiments may include a clamping transistor 353, controlled by voltage level V6 to couple the intermediate node 352 to the sense node 355, although other embodiments may not include a clamping transistor 353. A sense amplifier 380 may be coupled to the sense node 355 to detect a voltage level of the sense node 355 and provide an output 381.

Compensation current circuitry 370 and load current circuitry 390 may be coupled to the sense node 355. The load current circuitry may include a pFET controlled by a voltage level V9 from the control circuitry with the voltage of V9 determining a maximum load current provided by the load current circuitry 390 from the positive voltage source to the sense node 355. The compensation current circuitry 370 may include a field effect transistor (FET) 373 coupled from the sense node 355 to ground with a control gate driven from the FET 371. Another FET 372 may act as a capacitor to hold the control gate of the FET 373 at a constant value if the FET 371 is off.

During a sample period, the control circuitry may deselect the memory cells 301 by driving the word lines, such as word line 305, high. The control circuitry may drive V5 and V6 to turn on the isolation transistor 351 and clamping transistor 353, and drive V7 with a voltage to allow up to a predetermined reference current value to flow through the reference current circuitry 360. The control circuitry may also drive V9 with a voltage to allow up to a predetermined load current to flow through the load current circuitry 390 to the sense node 355. The control circuitry may then drive V8 high to turn on FET 371 so that the maximum amount of the compensation current flowing through the compensation current circuitry 370 is set based on $I_{OFF}$. Once the maximum amount of the compensation current is set, the FET 371 may be turned off by the control circuitry driving V8 to ground. With the memory cells 301 deselected, the current flowing through the isolation transistor 351 and through the memory cells 301 is an off-current, $I_{OFF}$. In memory 300 the maximum value of the compensation current, plus the maximum value of the load current, plus a value of the reference current, plus a value of $I_{OFF}$ of the memory cells 201, is about equal to zero, by Kirchoff's current law applied to the sense node 355. So the maximum value of the compensation current set for the compensation current circuitry 370 during the sample period is dependent on $I_{OFF}$ and may be shown by the equations:

$$I_{LOAD} - I_{COMPMAX} - I_{REF} - I_{OFF} = 0 \text{ so}$$
$$I_{COMPMAX} = I_{LOAD} - I_{REF} - I_{OFF}$$

During an access period, the control circuitry may drive the word line 305 low to select the memory cell 311. The word lines associated with the other memory cells 312-319 may be driven high to deselect the other memory cells 312-319. The control circuitry may turn on the isolation transistor 351 using V5 and the clamping transistor 353 using V6, and disable the reference current circuitry 360 by driving V7 to ground. The load current circuitry 390 is enabled with V9 to drive up to the max load current and the compensation current circuitry 370 continues to sink up to the maximum set value of the compensation current. So if the current through the selected memory cell 311 is $I_{MEM}$ and the number of memory cells coupled to the bit line 350 is large so that the current through the unselected memory cells is still about $I_{OFF}$, the equation for Kirchoff's current law at the sense node 355 is:

$$I_{LOAD} - I_{COMP} - I_{MEM} - I_{OFF} = 0 \text{ so } I_{MEM} = I_{LOAD} - I_{COMP} - I_{OFF}$$

with $I_{COMP} \leq I_{COMPAX}$:

$$I_{MEM} \leq I_{LOAD} - (I_{LOAD} - I_{REF} - I_{OFF}) - I_{OFF} \text{ or}$$

$$I_{MEM} \leq I_{REF}$$

Because $I_{REF}$ was chosen to be less than an expected maximum on-current of a memory cell, if the selected memory cell 311 is 'ON,' $I_{MEM} = I_{REF}$ and the voltage at the sense node 355 is a low voltage about equal to the 'ON' voltage of the selected memory cell 311, which may be detected by the sense amplifier 380. If the selected memory cell 311 is 'OFF,' very little current flows through the selected memory cell 311 so $I_{MEM} \ll I_{REF}$ and the voltage at the sense node 355 is a high voltage because the compensation current circuitry 370 limits the amount of current that the load current circuitry 390 is able to source, causing the load current circuitry to drive the sense node 355 to a voltage near the positive supply voltage. The high voltage at the sense node 355 may be detected by the sense amplifier 380.

While the compensation current circuitry 270 of FIG. 2A may include fewer transistors than the combined load current circuitry 390 and the compensation current circuitry 370 of FIG. 3, some embodiments may use the circuitry shown in FIG. 3. The circuitry shown in FIG. 3 may be able to provide for a wider voltage range at the sense node 355 than compensation current circuitry 270, which may be useful in some devices with low voltage power supplies.

Figure 4A:
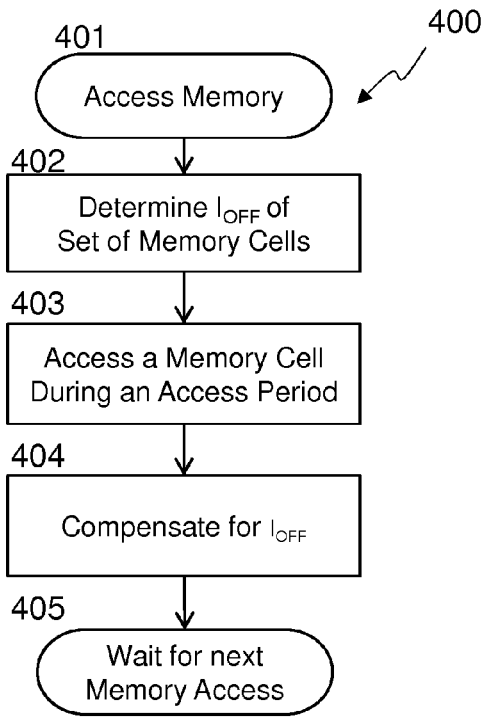
FIG. 4A-4C are flow charts of various aspects of embodiments of methods for compensating for off-current of a memory.
Figure 4B:
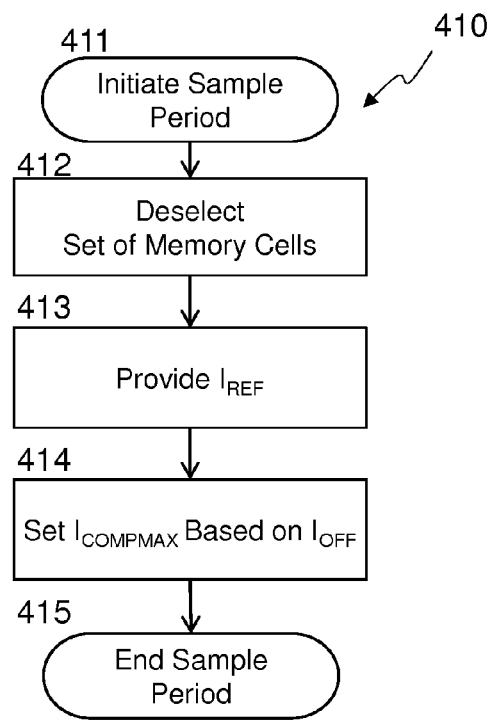
Figure 4C:
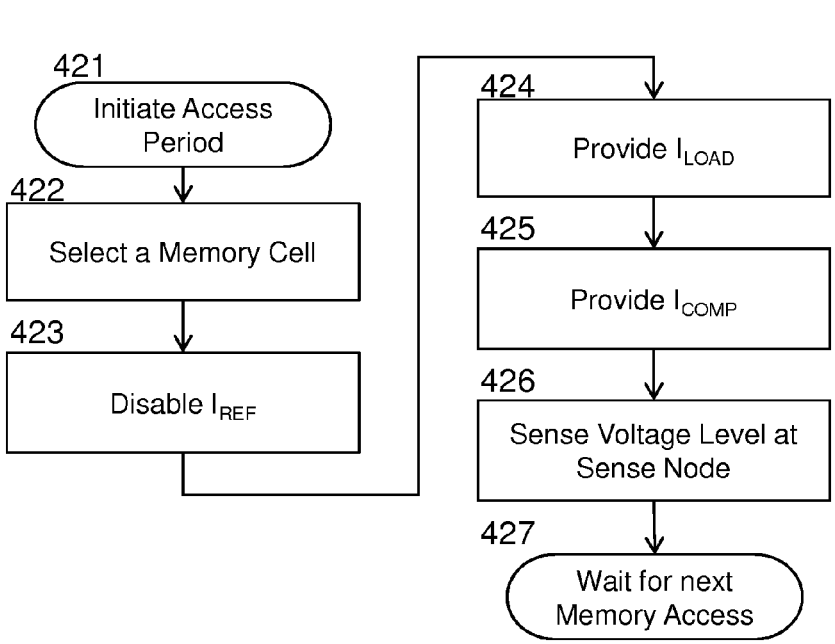

FIG. 4A-4C are flow charts 400, 410, 420 of various aspects of embodiments of methods for compensating for off-current of a memory. Flow chart 400 may begin with an access of memory at block 401. The access of memory 401 can be any type of access but in some embodiments the access may be a read command, a program command, or an erase command. The flow chart 400 may continue in response to the access at block 402 by determining an off-current ($I_{OFF}$) of a set of memory cells that are coupled to a sense node. Depending on the embodiment, $I_{OFF}$ may have already been determined before the memory is accessed at block 401. Block 403 may include accessing a memory cell of the set of memory cells during an access period and at block 404 the flow chart 400 continues with compensating for the off-current of the set of memory cells to determine a state of the accessed memory cell. If the access was a read command, the state of the memory cell may be provided in response to the read command. If the access was a program command or an erase command, the state of the memory cell may be checked to ensure that the command was completed successfully. The flow chart 400 may wait for the next memory access at block 405, ending the flow chart 400.

In at least one embodiment, the determining of the off-current in block 402 may involve storing digital information regarding measurements of the off-current during a sample period. This may involve an analog to digital conversion of the voltage at the sense node with the set of memory cells deselected at block 402. Then a digital value based on a measurement of current through the memory cell during the access period may be captured as a part of block 403. This may involve a second analog to digital conversion of the voltage at the sense node while accessing a memory cell at block 403. The off-current may then be compensated by subtracting at least some of the digital information from the digital value to determine a state of the memory cell at block 404.

In other embodiments, the determining of the off-current may involve setting a maximum compensation current based on the off-current at block 402. The accessing of the memory cell may include sensing a voltage level at the sense node to determine a state of the memory cell at block 403. The compensating for the off-current may include providing a compensation current at the sense node during the access period at block 404. The maximum value of the compensation current was set based on the off-current at block 402.

In some embodiments, blocks 403 and 404 may be repeated without repeating block 402. So the method may include accessing another memory cell of the set of memory cells during a second access period, and compensating for the off-current during the second access period without re-determining the off-current. In some embodiments, it may be determined whether or not to include block 402 in response to a memory access based on whether a predetermined period of time has elapses since the last determination of $I_{OFF}$ of the set of memory cells. So some embodiments may include re-determining the off-current if more than a predetermined period of time has passed since the determining of the off-current, accessing another memory cell of the set of memory cells during a second access period after the re-determining of the off-current, and compensating for the re-determined off-current during the second access period. In some embodiments, the predetermined period of time may be greater than about 1 µs.

FIG. 4B shows a flow chart 410 of a method to determine the off-current of the set of memory cells, which might be used for some embodiments of block 402 of flow chart 400. Control circuitry may initiate a sample period at block 411 to start determining the off-current. At least one sample period may occur before an access period. A sample period may be initiated in response to a change of temperature of the set of memory cells in some embodiments. In other embodiments, the sample period may be initiated before an access if the predetermined period of time has passed since the last sample period as described above. The flow chart 410 may continue by deselecting the set of memory cells coupled to the sense node at block 412. The control circuitry may provide a reference current at the sense node during the sample period at block 413. The value of the reference current may be less than an expected on-current of a memory cell. At block 414 the compensation current circuitry may be set to provide up to the maximum value of the compensation current based on $I_{OFF}$. The compensation current circuitry may provide up to maximum value of compensation current to the sense node after the end of the sample period, such as during the access period. So the maximum value of the compensation current, plus a value of the reference current, plus a value of the off-current, is about equal to zero, in some embodiments. In other embodiments, a load current may be provided at the sense node during the sample period, so that the maximum value of the compensation current, plus a maximum value of the load current, plus a value of the reference current, plus a value of the off-current, is about equal to zero.

FIG. 4C shows a flow chart 420 of a method to access a memory cell with compensation for $I_{OFF}$ such as might be done for embodiments of flow chart 400 in block 403 and block 404. The flow chart 420 may respond to an access of the memory by initiating an access period at block 421. The control circuitry may select a memory cell at block 422, and disable a source of reference current at block 423. In some embodiments, the method may include providing a load current to the sense node at block 424, although some embodiments may not include a load current. At block 425, the compensation current may be provided at the sense node. A maximum value of the compensation current may have been previously set during a sample period. The voltage level at the sense node may be sensed at block 426 to determine a state of the accessed memory cell. The next memory access may be waited on at block 427.

In various embodiments of the methods described by the flow charts 400, 410, 420, the set of memory cells may include one or more NAND strings of memory cells and/or one or more stacks of memory cells. In some embodiments, channels of the set of memory cells may include polysilicon and in some embodiments the set of memory cells may include phase change material.

Figure 5:
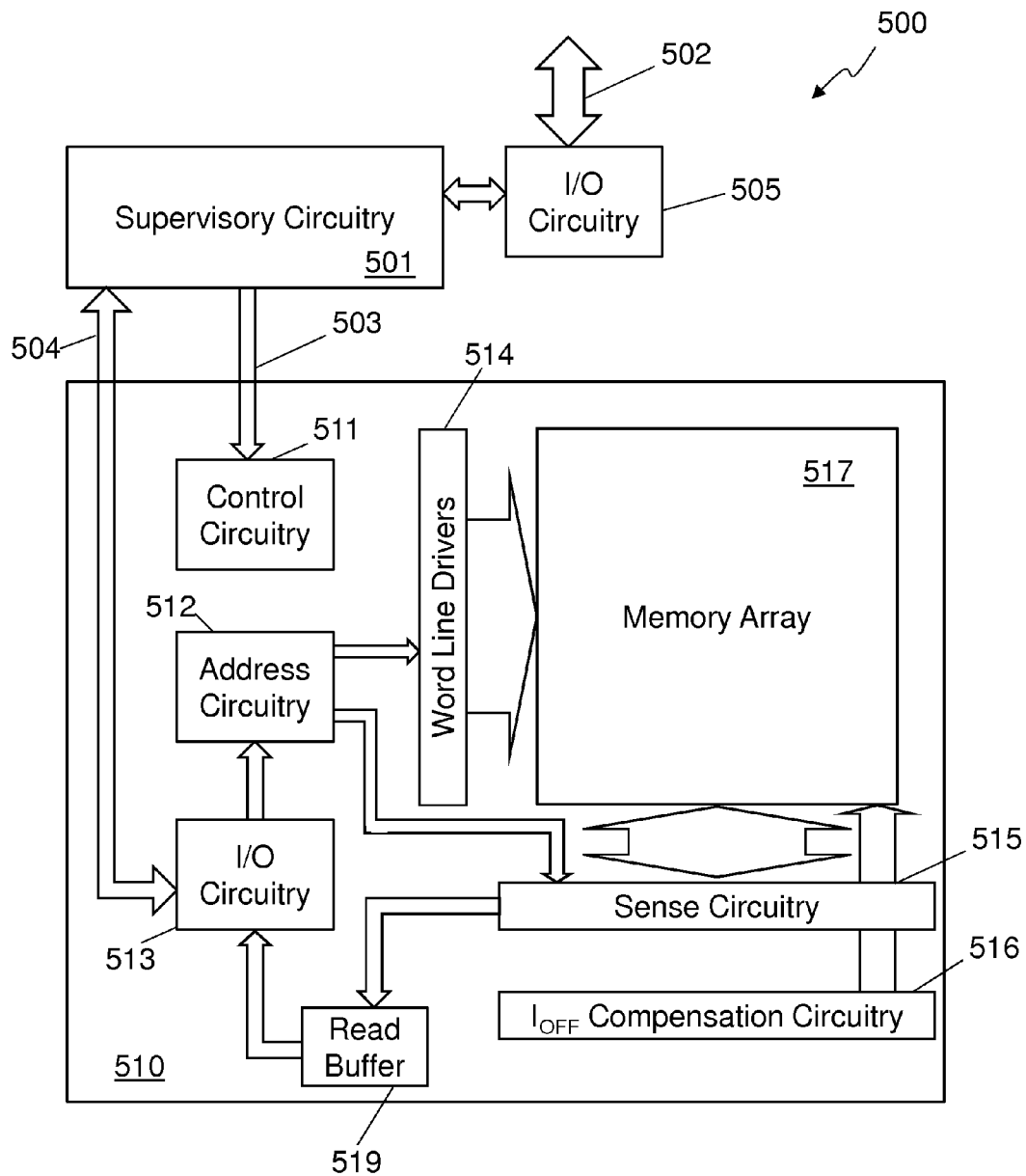
FIG. 5 is a block diagram of an embodiment of an electronic system with memory that compensates for off-current.

FIG. 5 is a block diagram of an embodiment of an electronic system 500 with memory 510 that compensates for off-current. Supervisory circuitry 501 is coupled to the memory device 510 with control/address lines 503 and data lines 504. In some embodiments, data and control may utilize the same lines. The supervisory circuitry 501 may be a processor, microprocessor, microcontroller, finite state machine, or some other type of controlling circuitry. The supervisory circuitry 501 may execute instructions of a program in some embodiments. In some embodiments, the supervisory circuitry 501 may be integrated in the same package or even on the same die as the memory device 510. In some embodiments, the supervisory circuitry 501 may be integrated with the control circuitry 511, allowing some of the same circuitry to be used for both functions. The supervisory circuitry 501 may have external memory, such as random access memory (RAM) and read only memory (ROM), used for program storage and intermediate data or it may have internal RAM or ROM. In some embodiments, the processor may use the memory device 510 for program or data storage. A program running on the supervisory circuitry 501 may implement many different functions including, but not limited to, an operating system, a file system, memory block remapping, and error management.

In some embodiments an external connection 502 is provided. The external connection 502 is coupled to input/output (I/O) circuitry 505 which may then be coupled to the supervisory circuitry 501 and allows the supervisory circuitry 501 to communicate to external devices. In some embodiments, the I/O circuitry 505 may be integrated with the supervisory circuitry 501 so that the external connection 502 is directly coupled to the supervisory circuitry 501. If the electronic system 500 is a storage system, the external connection 502 may be used to provide an external device with non-volatile storage. The electronic system 500 may be a solid-state drive (SSD), a USB thumb drive, a secure digital card (SD Card), or any other type of storage system. The external connection 502 may be used to connect to a computer or other intelligent device such as a cell phone or digital camera using a standard or proprietary communication protocol. Examples of computer communication protocols that the external connection may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express (PCI-e).

If the electronic system 500 is a computing system, such as a mobile telephone, a tablet, a notebook computer, a set-top box, or some other type of computing system, the external connection 502 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)-Terrestrial, DVB-Cable, and Advanced Television Committee Standard (ATSC), and mobile telephone communication protocols such as Global System for Mobile Communication (GSM), protocols based on code division multiple access (CDMA) such as CDMA2000, and Long Term Evolution (LTE).

The memory device 510 may include an array 517 of memory cells. The memory cells may be organized into using any architecture and may use any type of memory technology. Address lines and control lines 503 may be received and decoded by control circuitry 511, I/O circuitry 513 and address circuitry 512 which may provide control to the memory array 517 through the word line drivers 514 and/or the sense circuitry 515. I/O circuitry 513 may couple to the data lines 504 allowing data to be received from and sent to the supervisory circuitry 501. $I_{OFF}$ compensation circuitry 516 may work in conjunction with the sense circuitry 515 to correctly determine the state of memory cells of the memory array 517 by compensating for the off-current of the memory array 517. Data read from the memory array 517 may be temporarily stored in read buffers 519.

The system illustrated in FIG. 5 has been simplified to facilitate a basic understanding of the features of the system. Many different embodiments are possible including using a single supervisory circuitry 501 to control a plurality of memory devices 510 to provide for more storage space. Additional functions, such as a video graphics controller driving a display, and other devices for human oriented I/O may be included in some embodiments.

The flowchart and/or block diagrams in the figures help to illustrate the architecture, functionality, and operation of possible implementations of systems, methods and computer program products of various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Examples of various embodiments are described in the following paragraphs:

An example method to access a memory cell may include sensing an off-current of a set of memory cells during a sample period, providing a compensation current at the sense node during an access period, and determining a state of a memory cell of the set of memory cells during the access period. In the example method the set of memory cells are coupled to a sense node and the compensation current is dependent on the off-current. An example method to access a memory cell may include determining an off-current of a set of memory cells that are coupled to a sense node, accessing a memory cell of the set of memory cells during an access period, and compensating for the off-current of the set of memory cells to determine a state of the memory cell. In some example methods the determining of the off-current may include storing digital information regarding measurements of the off-current during a sample period, the accessing of the memory cell may include capturing a digital value based on a measurement of current through the memory cell during the access period, and the compensating for the off-current may include subtracting at least some of the digital information from the digital value to determine a state of the memory cell. In some example methods the compensating for the off-current may include providing a compensation current at the sense node during the access period, and the accessing of the memory cell may include sensing a voltage level at the sense node to determine a state of the memory cell. A maximum value of the compensation current may be based on the off-current. In some example methods the determining of the off-current may include deselecting the set of memory cells and providing a reference current at the sense node during a sample period, and setting a circuit to provide up to the maximum value of the compensation current at the sense node during the access period. In some example methods the accessing of the memory cell may include selecting the memory cell, and disabling a source of the reference current. In some example methods the maximum value of the compensation current, plus a value of the reference current, plus a value of the off-current, is about equal to zero, the sample period occurs before the access period, and the value of the reference current is less than an expected on-current of the memory cell. In some example methods the determining of the off-current may include deselecting the set of memory cells and providing a reference current and a load current at the sense node during a sample period, and setting a circuit to provide up to the maximum value of the compensation current at the sense node during the access period. In some example methods the accessing of the memory cell may include selecting the memory cell, providing the load current to the sense node, and disabling a source of the reference current. In some example methods the maximum value of the compensation current, plus a maximum value of the load current, plus a value of the reference current, plus a value of the off-current, is about equal to zero, the sample period occurs before the access period, and the value of the reference current is less than an expected on-current of the memory cell. In some example methods the set of memory cells may include NAND strings of memory cells, stacks of memory cells, polysilicon channels, or phase change material. Some example methods may also include accessing another memory cell of the set of memory cells during a second access period, and compensating for the off-current during the second access period without re-determining the off-current. Some example methods may also include re-determining the off-current if more than a predetermined period of time has passed since the determining of the off-current, accessing another memory cell of the set of memory cells during a second access period after the re-determining of the off-current, and compensating for the re-determined off-current during the second access period. In some example methods the predetermined period of time is greater than about 1 microsecond. In some example methods the determining of the off-current occurs in response to a change of temperature of the set of memory cells. In some example methods the accessing of the memory cell occurs in response to a read command, a program command, or an erase command. Any combination of the examples of this paragraph may be used in embodiments.

An example memory may include two or more memory cells coupled to a sense node, with the two or more memory cells having a combined off-current. The example memory may include sense circuitry, coupled to the sense node, to determine a state of a memory cell of the two or more memory cells in response to an access of the memory, and compensation circuitry to compensate for the combined off-current. In some example memories, the two or more memory cells may include two or more NAND strings of memory cells. In some example memories, the two or more memory cells may include one or more stacks of memory cells. In some example memories, the two or more memory cells may include polysilicon channels. In some example memories, the two or more memory cells may include phase change material. In some example memories, the compensation circuitry may include reference current circuitry and compensation current circuitry coupled to the sense node. In some example memories, may also include control circuitry to deselect the two or more memory cells and enable the reference current circuitry to provide a reference current at the sense node, during a sample period. The control circuitry may also set the compensation current circuitry, during the sample period, to provide up to a maximum value of compensation current at the sense node during an access period that occurs after the sample period, wherein the maximum value of the compensation current is based on the combined off-current and the reference current. The control circuitry may also select the memory cell and disable the reference current circuitry, during the access period, in response to the access of the memory. In some example memories, the reference current is less than an on-current of the memory cell, and a voltage level of the sense node during the access period indicates the state of the memory cell. In some example memories, the maximum value of the compensation current, plus a value of the reference current, plus a value of the combined off-current, is about equal to zero. Some example memories may also include load current circuitry to provide a load current at the sense node. The maximum value of the compensation current, plus a maximum value of the load current, plus a value of the reference current, plus a value of the combined off-current, may be about equal to zero, in some examples. In some example memories, the sample period is initiated by the control circuitry in response to a change of temperature of the two or more memory cells. In some example memories, the control circuitry, during a second access period initiated in response to a second memory access, may be further capable to select another memory cell of the two or more memory cells, disable the reference current circuitry, and enable the compensation current circuitry to provide up to the maximum value of compensation current at the sense node. In some example memories, the voltage level of the sense node during the second access period indicates the state of the another memory cell. In some example memories, the control circuitry, if more than a predetermined period of time has passed since the sample period, during a second sample period may be further capable to deselect the two or more memory cells, enable the reference current circuitry to provide the reference current at the sense node, and re-set the compensation current circuitry to provide up to a new maximum value of compensation current at the sense node during the second access period, wherein the new maximum value of the compensation current is based on the reference current and a combined off-current of the two or more memory cells during the second sample period. The second sample period occurs before the second access period in some examples. In some example memories, the predetermined period of time is greater than about 1 microsecond. Any combination of the examples of this paragraph may be used in embodiments.

An example electronic system may include supervisory circuitry to generate a memory access, and at least one memory coupled to the supervisory circuitry. The at least one memory may be described in the preceding paragraph. Some example electronic systems may also include I/O circuitry, coupled to the supervisory circuitry, to communicate with an external device. Any combination of the examples of this paragraph and the preceding paragraph may be used in embodiments.

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. A method to access a memory cell, the method comprising:
   determining an off-current of a set of memory cells that are coupled to a sense node;
   accessing a memory cell of the set of memory cells during an access period; and
   compensating for the off-current of the set of memory cells by subtracting at least some of the off-current from current flowing through the memory cell during the access period to determine a state of the memory cell.

2. The method of claim 1, wherein the compensating for the off-current comprises providing a compensation current at the sense node during the access period; and
   the accessing of the memory cell comprises sensing a voltage level at the sense node to determine a state of the memory cell;
   wherein a maximum value of the compensation current is based on the off-current.

3. The method of claim 2, wherein the determining of the off-current comprises deselecting the set of memory cells and providing a reference current at the sense node during a sample period, and setting a circuit to provide up to the maximum value of the compensation current at the sense node during the access period; and
   the accessing of the memory cell comprises selecting the memory cell, and disabling a source of the reference current;
   wherein the maximum value of the compensation current, plus a value of the reference current, plus a value of the off-current, is about equal to zero;
   the sample period occurs before the access period; and
   the value of the reference current is less than an expected on-current of the memory cell.

4. The method of claim 2, wherein the determining of the off-current comprises deselecting the set of memory cells and providing a reference current and a load current at the sense node during a sample period, and setting a circuit to provide up to the maximum value of the compensation current at the sense node during the access period; and
   the accessing of the memory cell comprises selecting the memory cell, providing the load current to the sense node, and disabling a source of the reference current;
   wherein the maximum value of the compensation current, plus a maximum value of the load current, plus a value of the reference current, plus a value of the off-current, is about equal to zero;
   the sample period occurs before the access period; and
   the value of the reference current is less than an expected on-current of the memory cell.

5. The method of claim 1, further comprising accessing another memory cell of the set of memory cells during a second access period, and compensating for the off-current during the second access period without re-determining the off-current.

6. The method of claim 1, further comprising:
   re-determining the off-current if more than a predetermined period of time has passed since the determining of the off-current;

accessing another memory cell of the set of memory cells during a second access period after the re-determining of the off-current; and compensating for the re-determined off-current during the second access period.

7. The method of claim 6, wherein the predetermined period of time is greater than about 1 microsecond.

8. The method of claim 1, wherein the determining of the off-current occurs in response to a change of temperature of the set of memory cells.

9. The method of claim 1, wherein the accessing of the memory cell occurs in response to a read command, a program command, or an erase command.

10. A memory comprising:
two or more memory cells coupled to a sense node, wherein the two or more memory cells have a combined off-current;
sense circuitry, coupled to the sense node, to determine a state of a memory cell of the two or more memory cells in response to an access of the memory; and
compensation circuitry to compensate for the combined off-current of the cells by subtracting at least some of the combined off-current from current flowing through the memory cell during the access of the memory.

11. The memory of claim 10, wherein the two or more memory cells comprise two or more NAND strings of memory cells.

12. The memory of claim 10, wherein the two or more memory cells comprise one or more stacks of memory cells.

13. The memory of claim 10, wherein the two or more memory cells comprise polysilicon channels.

14. The memory of claim 10, wherein the two or more memory cells comprise phase change material.

15. The memory of claim 10, wherein the compensation circuitry comprises reference current circuitry and compensation current circuitry coupled to the sense node; and
the memory further comprising control circuitry to:
deselect the two or more memory cells and enable the reference current circuitry to provide a reference current at the sense node, during a sample period;
set the compensation current circuitry, during the sample period, to provide up to a maximum value of compensation current at the sense node during an access period that occurs after the sample period, wherein the maximum value of the compensation current is based on the combined off-current and the reference current; and
select the memory cell and disable the reference current circuitry, during the access period, in response to the access of the memory;
wherein the reference current is less than an on-current of the memory cell, and a voltage level of the sense node during the access period indicates the state of the memory cell.

16. The memory of claim 15, wherein the maximum value of the compensation current, plus a value of the reference current, plus a value of the combined off-current, is about equal to zero.

17. The memory of claim 15, further comprising load current circuitry to provide a load current at the sense node, wherein the maximum value of the compensation current, plus a maximum value of the load current, plus a value of the reference current, plus a value of the combined off-current, is about equal to zero.

18. The memory of claim 15, wherein the sample period is initiated by the control circuitry in response to a change of temperature of the two or more memory cells.

19. The memory of claim 15, wherein the control circuitry, during a second access period initiated in response to a second memory access, is further capable to select another memory cell of the two or more memory cells, disable the reference current circuitry, and enable the compensation current circuitry to provide up to the maximum value of compensation current at the sense node;
wherein the voltage level of the sense node during the second access period indicates the state of the another memory cell.

20. The memory of claim 19, wherein the control circuitry, if more than a predetermined period of time has passed since the sample period, during a second sample period is further capable to:
deselect the two or more memory cells;
enable the reference current circuitry to provide the reference current at the sense node; and
re-set the compensation current circuitry to provide up to a new maximum value of compensation current at the sense node during the second access period, wherein the new maximum value of the compensation current is based on the reference current and a combined off-current of the two or more memory cells during the second sample period;
wherein the second sample period occurs before the second access period.

21. An electronic system comprising:
supervisory circuitry to generate a memory access; and
at least one memory coupled to the supervisory circuitry, the at least one memory comprising:
two or more memory cells coupled to a sense node, wherein the two or more memory cells have a combined off-current;
sense circuitry, coupled to the sense node, to determine a state of a memory cell of the two or more memory cells in response to the memory access; and
compensation circuitry to compensate for the combined off-current of the cells by subtracting at least some of the combined off-current from current flowing through the memory cell during the memory access.

22. The electronic system of claim 21, wherein the two or more memory cells comprise at least one of NAND strings of memory cells, stacks of memory cells, polysilicon channels, or phase change material.

23. The electronic system of claim 21, further comprising:
I/O circuitry, coupled to the supervisory circuitry, to communicate with an external device.

24. The electronic system of claim 21, wherein the electronic system comprises a solid state drive.

25. The electronic system of claim 21, wherein the compensation circuitry comprises reference current circuitry and compensation current circuitry coupled to the sense node; and
the at least one memory further comprises control circuitry to:
deselect the two or more memory cells and enable the reference current circuitry to provide a reference current at the sense node, during a sample period;
set the compensation current circuitry, during the sample period, to provide up to a maximum value of compensation current at the sense node during an access period that occurs after the sample period, wherein the maximum value of the compensation current is based on the combined off-current and the reference current; and
select the memory cell and disable the reference current circuitry, during the access period, in response to the memory access;

wherein the reference current is less than an on-current of the memory cell, and a voltage level of the sense node during the access period indicates the state of the memory cell.

26. The electronic system of claim 24, wherein the maximum value of the compensation current, plus a value of the reference current, plus a value of the combined off-current, is about equal to zero.

27. The electronic system of claim 24, the at least one memory further comprising load current circuitry to provide a load current at the sense node, wherein the maximum value of the compensation current, plus a maximum value of the load current, plus a value of the reference current, plus a value of the combined off-current, is about equal to zero.

28. The electronic system of claim 24, wherein the control circuitry, during a second access period initiated in response to a second memory access from the supervisory circuitry, is further capable to select another memory cell of the two or more memory cells, disable the reference current circuitry, and enable the compensation current circuitry to provide up to the maximum value of compensation current at the sense node;

wherein the voltage level of the sense node during the second access period indicates the state of the another memory cell.

29. The electronic system of claim 28, wherein the control circuitry, if more than a predetermined period of time has passed since the sample period, during a second sample period is further capable to:

deselect the two or more memory cells;

enable the reference current circuitry to provide the reference current at the sense node; and re-set the compensation current circuitry to provide up to a new maximum value of compensation current at the sense node during the second access period, wherein the new maximum value of the compensation current is based on the reference current and a combined off-current of the two or more memory cells during the second sample period;

wherein the second sample period occurs before the second access period.

* * * * *